United States Patent [19]

Wu

[11] 4,327,424
[45] Apr. 27, 1982

[54] READ-ONLY STORAGE USING ENHANCEMENT-MODE, DEPLETION-MODE OR OMITTED GATE FIELD-EFFECT TRANSISTORS

[75] Inventor: Philip T. Wu, Rochester, Minn.

[73] Assignee: International Business Machines Corporation, Armonk, N.Y.

[21] Appl. No.: 169,542

[22] Filed: Jul. 17, 1980

[51] Int. Cl.³ .................... G11C 17/00; G11C 11/40
[52] U.S. Cl. .................................. 365/104; 365/168
[58] Field of Search ............ 365/104, 168, 189, 178

[56] References Cited

U.S. PATENT DOCUMENTS

| | | | |
|---|---|---|---|
| 3,656,117 | 4/1972 | Maley et al. | 365/168 |
| 4,271,421 | 6/1981 | McElroy | 365/104 |
| 4,287,570 | 9/1981 | Stark | 365/104 |

OTHER PUBLICATIONS

Zbrozek, "Enhanced Performance 'AND' Rom", IBM Tech. Disc. Bul., vol. 23, No. 11, pp. 5011–5012.
Irving et al, "Flip-Flops for Multiple-Valued Logic", IEEE Transactions on Computers, vol. C-25, No. 3, pp. 237–246.

*Primary Examiner*—Stuart N. Hecker
*Attorney, Agent, or Firm*—J. Michael Anglin

[57] ABSTRACT

Read-only storage chip stores three levels per single-FET cell by providing each cell with an enhancement gate, a depletion gate or no gate connection. Level decoders convert pairs of these three-level signals to triplets of two-level data signals for binary output from the ROS.

6 Claims, 5 Drawing Figures

READ-ONLY STORAGE USING ENHANCEMENT-MODE, DEPLETION-MODE OR OMITTED GATE FIELD-EFFECT TRANSISTORS

BACKGROUND OF THE INVENTION

The present invention relates to static information storage and retrieval, and more specifically concerns read-only storage systems using field-effect transistors as storage elements.

High-density read-only storage (ROS) integrated circuits conventionally use a two-dimensional array of storage cells each holding one binary bit of data. Each cell has a single field-effect transistor (FET), and the state of the data stored in the cell is specified by either including or omitting the gate connection to the FET. When the cell is addressed, one of two different voltage levels appears on a bit line, to be sensed and output as a binary data signal.

One approach to increasing the density of a ROS is a straightforward reduction in the size of each cell. Another approach, which may be used in conjunction with size reduction, is to increase the number of different signal levels which can be stored within one cell. U.S. Pat. No. 3,484,762 to D. A. Meier, for example, shows a magnetic ROS array capable of storing three levels in each addressable element. U.S. Pat. No. 3,656,117 to G. A. Maley et al, shows a three-level ROS having multiple bipolar transistors in each cell. More recently, U.S. Pat. No. 4,202,044 to K. E. Beilstein, Jr. et al. discloses a ROS array which achieves four levels with a single FET per cell by the use of controlled amounts of ion implantation to produce four distinct threshold voltages. All of the FETs, however, are of a single type such as enhancement-mode. The Maley ROS sacrifices density by using multiple transistors per cell. Even the Beilstein "quaternary" system, although of high density at the present time, requires a separate additional process step for each threshold level, thereby increasing cost and complexity.

SUMMARY OF THE INVENTION

The present invention provides a 50% density increase without using any additional processing steps. This density increase is fully capable of tracking all size scalings which may occur in the future, since it does not itself require any size reductions. Any fabrication facility now producing FET integrated-circuit modules can realize an immediate density increase without introducing any new processes, and the invention can participate in the advantages of new processes and technologies as well.

Broadly, the invention proposes a ROS system including a matrix of single-FET storage cells. The FET of each cell is provided with one of three gate configurations: an enhancement-mode gate, a depletion-mode gate, or no gate connection at all. This results in one of three different output levels when the cell is addressed. One (or more) level decoder converts a pair of the three-level or ternary signals (nine possible combinations) into a triplet of two-level or binary data signals (eight possible combinations) to be output from the ROS.

DRAWING

FIG. 1 schematically shows a read-only storage module constructed according to the present invention.

FIG. 2 shows two rows of storage cells from the storage matrix of FIG. 1.

FIG. 3 tabulates the signal combinations produced by the level decoders of FIG. 1.

FIG. 4 illustrates a detailed implementation of the level decoders of FIG. 1.

FIG. 5 graphs the time relationships among the signals produced by the timing means of FIG. 1 for use by the level-decoder implementation of FIG. 4.

DETAILED DESCRIPTION

Figure 1:
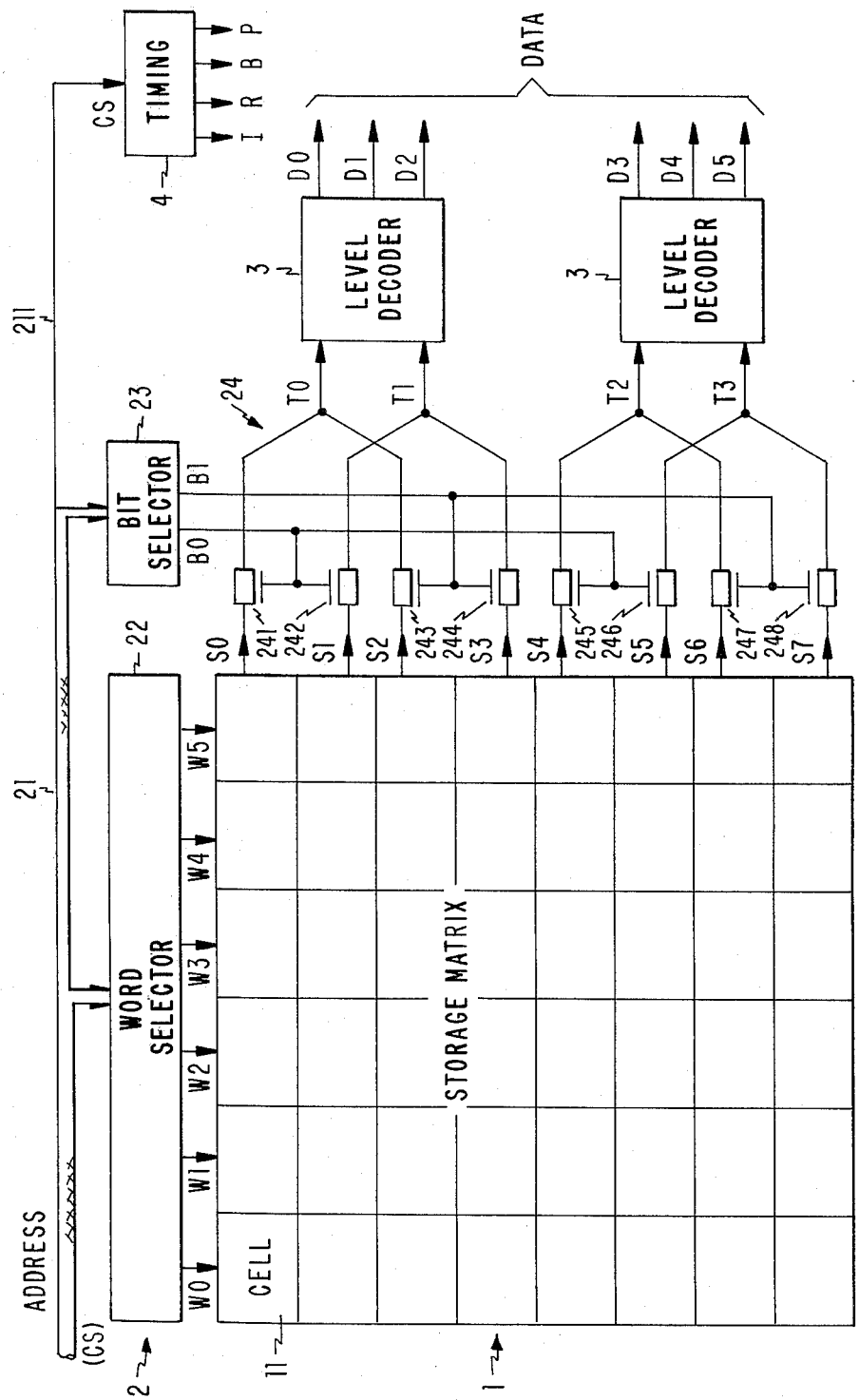

FIG. 1 shows an overview of a read-only storage (ROS) chip according to the invention. A rectangular storage matrix 1 of conventional organization comprises a large number of individual storage cells 11, shown in greater detail in FIG. 2. Each row of cells produces one of the three-level (ternary) row sigals S0, S1, etc.

Conventional addressing means 2 selectively couples certain storage cells 11 to level decoders 3 accordng to two-level (binary) externally supplied address signals on lines 21. Some of the lines 21 select one particular column of cells by means of a word selector 22, which may be a conventional linear decoder for producing word-line signals W0, W1, etc. Bit selector 23 may be another linear decoder for producing bit-select signals B0, B1, etc. These signals cause multiplexor 24 to selectively couple certain of the three-level row signals to signals T0, T1, etc. For example, a binary high level on B0 causes FET 241 to couple S0 to T0, while the simultaneous low level on B1 decouples S2 from T0, and similarly for the other signals. Lines B0, B1 bias FETs 241, 242, etc. in a conventional manner so as to eliminate any source/drain threshold voltage drop, so that the three levels of the S signals are preserved in the T signals. One of the address lines 21 may carry a conventional chip-select (CS) signal 211 whose inactive level disables all of the signals W0, W1, . . . , B0, B1, etc. The active level of CS signal 211 also controls a conventional on-chip timing generator 4, whose outputs I, R, B, P will be discussed in connection with FIG. 5.

Level decoders 3 convert pairs of the three-level signals such as T0, T1 and T2, T3 into triplets of two-level (binary) output data signals such as D0, D1, D2 and D3, D4, D5, respectively. A ROS module contains as many level decoders as required to produce the desired number of data outputs. The two decoders of FIG. 1. for example, produce six parallel binary outputs. The common "nine-wide" organization, eight parallel data bits plus one parity bit, is accomplished with only three decoders. Thus, even relatively complex decoders 3 do not add any significant overall size or other penalty to a ROS chip.

Figure 2:
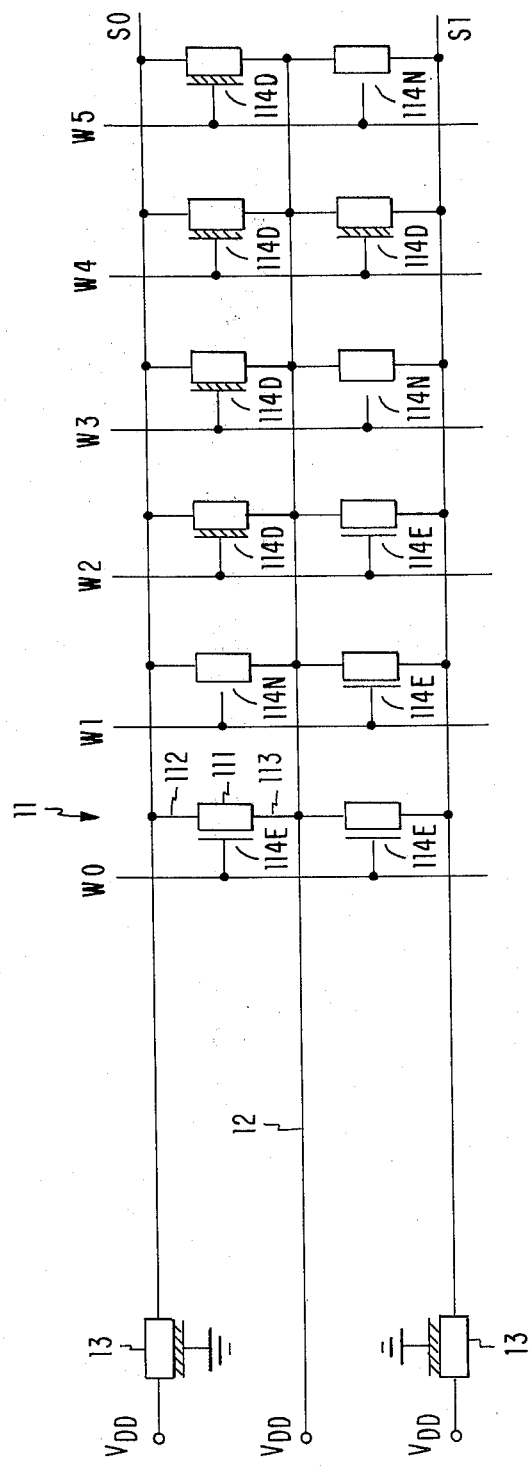

FIG. 2 shows two rows of cells 11. The physical layout of the cells may use the conventional "half-contact per cell" configuration. This allows the advantages of the invention to be realized without requiring any reduction in pitch of cells 11 (i.e., without any increase in array density) and without any new technology. Every cell location contains an N-channel FET 111 having a drain 112 coupled to one of the bit lines S0, S1, etc. and a source 113 coupled to a power-supply bus 12 at VDD volts above ground potential. Each FET has one of three different gate configurations: an enhancement-mode gate such as 114E, a depletion-mode gate such as 114D, or no gate at all as at 114N. The enhancement and depletion gates may both be fabricated by conventional processes.

Let VTE and VTD represent the threshold voltages of an enhancement-mode FET (EFET) and a depletion-mode FET (DFET), respectively. For the sake of a particular example, let VDD=8.5, VTE=1.2 and VTD=−2.0. When none of the word lines W0–W5 are energized, driver DFET 13 holds row line S0 at |VTD|=2.0. If word line W0 is then energized, S0 moves to VDD-VTE=7.3. Alternatively, if W2 is energized instead of W0, then S0 goes to VDD=8.5. Thirdly, if W1 is raised instead of W0 and W2, then S0 remains at VTE=2.0, since the absence of a gate at 114N precludes the FET of that cell from going into conduction. Therefore the row line S0 will carry one of three different voltage levels, 8.5, 7.3 or 2.0, depending upon whether the addressed storage cell 11 was fabricated with a depletion gate, an enhancement gate or no gate connection. The cells connected to row line S1 operate in the same manner to produce another three level output signal when addressed by one of the word lines W0–W5.

Figure 3:
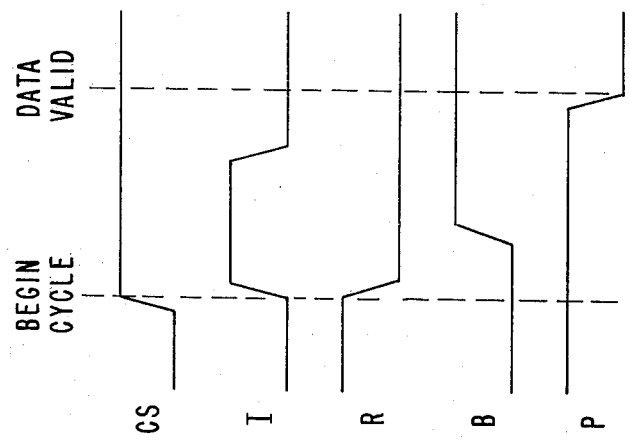

FIG. 3 shows the nine possible combinations of the pairs of three-level signals produced on lines S0, S1 when the cell array 11 is adressed by enabling a particular word line. Again, the letters N, E and D signify no gate, an enhancement gate and a depletion gate in the addressed cell. FIG. 3 also shows how this pair of three-level signals may be assigned to represent the eight possible combinations of a triplet of two-level or binary data signals D0, D1, D2. One of the S0, S1 combinations, ED, is not used. The assignment of S0, S1 pairs to specific D0, D1, D2 triplets is logically arbitrary and may thus be done to minimize decoder complexity, for example.

Figure 4:
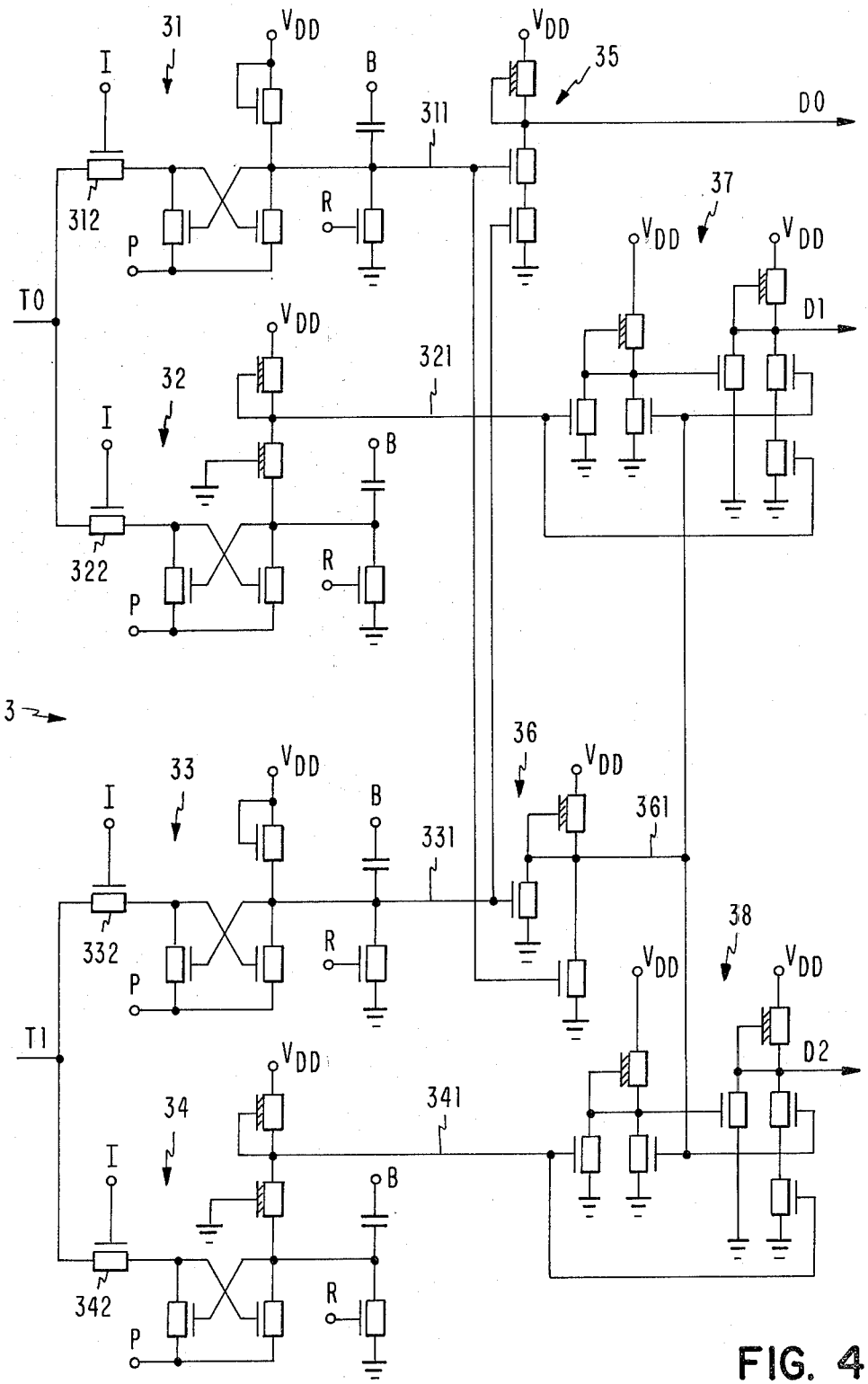

FIG. 4 shows a level decoder 3 for translating pairs of the three-level signals T0–T3 (selected from among row signals S0–S7 by bit selector 23, FIG. 1) to triplets of two-level data signals D0–D5. Broadly, sense circuit 31 produces a binary high (1) intermediate signal on line 311 whenever three-level signal T0≦7.3, i.e., for E or N gates in the addressed storage cell. For T0=8.5 (D gate), line 311 is low (0). The binary 0 and 1 levels may be about 0.5 and ≧5.0 volts, respectively. Circuit 32 produces a binary 1 intermediate signal on line 321 whenever T0≦2.0, i.e., only for the N gate condition. Sense circuits 33 and 34 operate similarly for the three-level signal T1. The inputs to sense circuits 31–34 are gated through FETs 312–342 by a conventional clock signal I having a timing shown in FIG. 5; these FETs are conventionally biased to eliminate any source/drain threshold voltage drop. Other timing signals R and P cause circuits 31–34 to latch their inputs for the duration of a memory cycle. Timing signal B is coupled to the latches through a small capacitor to perform a conventional steering function for ensuring that latching is achieved correctly. That is, sense circuits 31–34 also act as latches for the binary intermediate signals 311–341.

Data output D0 is generated by logic circuit 35 from the binary NAND of signals 311 and 331. That is, D0 is low (0) when both T0 and T1 are equal to or less than 7.3, i.e. for the combinations NN, NE, EN, EE of T0, T1 in FIG. 3. Logic circuit 36 produces the logic NOR of signals 311 and 331. That is, line 361 is high only when 311 and 331 are both low; this corresponds to the DD combination in FIG. 3. Two identical logic circuits 37 and 38 perform an exclusive-or (XOR) logic function upon signal 361 and another signal. These circuits may also be thought of as controlled inverters which invert their inputs 321 or 341 only when signal 361 is high. Therefore, D1, the output of circuit 37, has a binary high level whenever T0 indicates an N gate condition; D1 is low for E or D gates, except that it is also high for the case when both T0 and T1 indicate the DD gate combination in the addressed cell 11, FIG. 1. Circuit 38 similarly causes binary data signal D2 to be high for the N gate condition of signal T1 and low for E or D gates, except that it also returns a high level for the DD combination. All of the different combinations by which the logic circuits of decoder 3 produce the data output signals are set out in FIG. 3. Again, other logic functions may be used, depending upon the assignment of the three-level values of T0, T1 to the two-level values of D0, D1, D2. Moreover, the specific implementation of any particular logic function is not material to the concepts of the invention.

The clock signals I,R,B,P of FIG. 5 are initiated by the chip-select signal CS at the beginning of a memory cycle. Their transitions during the cycle may be controlled by conventional delays, timers or single-shots of simple design. Absolute time values for these signals are not critical; in some cases they might not be required at all.

I claim as my invention:
1. A read-only storage, comprising:
 a storage matrix having a number of cells each comprising a field-effect transistor having one of three different gate configurations, said configurations including an enhancement-mode gate, a depletion-mode gate and no gate, said cells being capable of producing three-level signals depending upon said gate configurations; and
 at least one level decoder responsive to a pair of said three-level signals for producing a triplet of two-level data signals.
2. The read-only storage of claim 1 wherein said level decoder comprises:
 a number of sense circuits for producing two-level intermediate signals; and
 a number of logic circuits for producing said data output signals from different combinations of said intermediate signals.
3. The read-only storage of claim 2 wherein said sense circuits are further adapted to latch said intermediate signals.
4. The read-only storage of claim 1 further comprising:
 addressing means responsive to address signals for selectively coupling said storage cells to said level decoders.
5. The read-only storage of claim 4 wherein said addressing means includes:
 a bit selector responsive to some of said address signals for producing bit-select signals; and
 a multiplexor responsive to said bit-select signals for selecting said different pairs of three-level signals.
6. The read-only storage of claim 5 wherein said multiplexor comprises a number of field-effect transistors biased so as to have no threshold voltage drop thereacross.

* * * * *